(12) United States Patent
Howard et al.

(10) Patent No.: US 6,847,106 B1
(45) Date of Patent: Jan. 25, 2005

(54) SEMICONDUCTOR CIRCUIT WITH MECHANICALLY ATTACHED LID

(75) Inventors: Gregory E. Howard, Dallas, TX (US); Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/676,669

(22) Filed: Oct. 1, 2003

(51) Int. Cl.[7] .................. H01L 23/22; H01L 23/24; H01L 23/48; H01L 23/04; H01L 23/12

(52) U.S. Cl. ............... 257/687; 257/690; 257/698; 257/700; 257/704

(58) Field of Search ................................. 257/678, 687, 257/690, 698, 700, 704

(56) References Cited

U.S. PATENT DOCUMENTS

2003/0205800 A1 * 11/2003 Kim et al. .................. 257/684
2004/0135239 A1 * 7/2004 Radu et al. ................. 257/678
2004/0178494 A1 * 9/2004 Lin et al. .................... 257/704

* cited by examiner

*Primary Examiner*—Ngân V. Ngô
(74) *Attorney, Agent, or Firm*—Yingsheng Tung; Wade James Brady, III; Frederick J. Telecky, Jr.

(57) ABSTRACT

One aspect of the invention is a semiconductor circuit comprising a semiconductor die electrically connected to a package substrate through a plurality of electrical contacts. A lid above and substantially parallel to the top surface of the die forms a portion of the semiconductor circuit package. A plurality of lid supports each comprising a post and standoff member collectively create a separation between the lid and top surface of the die.

20 Claims, 1 Drawing Sheet

SEMICONDUCTOR CIRCUIT WITH MECHANICALLY ATTACHED LID

TECHNICAL FIELD OF THE INVENTION

This invention relates generally to semiconductor circuit packaging and more particularly to a semiconductor circuit with a mechanically attached lid.

BACKGROUND OF THE INVENTION

One aspect of packaging for semiconductor circuits concerns the attachment of a lid (often a thermal lid) to the package. Normally, it is desirable to attach the lid in a manner to obtain good thermal conductivity between the semiconductor die and the lid. Such attachment allows heat to be dissipated through the lid. Thermal lids are frequently used in flip chip packages such as ball grid arrays, pin grid arrays, and/or column grid arrays.

In existing applications, the thermal lid is frequently attached to the package using a lid attach epoxy. Unfortunately, lid attach epoxy which has high strength (thus reducing the likelihood of the lid popping off) usually performs poorly from a thermal conductivity point-of-view. On the other hand, lid attach epoxy which performs well thermally often does not provide good bonding strength.

In some applications, a heat sink is attached to the thermal lid to further aid in the dissipation of heat from the semiconductor circuit contained within the package. The attachment of the heat sink, however, often puts force on the semiconductor package lid and the die underneath and can damage the die.

SUMMARY OF THE INVENTION

One aspect of the invention is a semiconductor circuit comprising a semiconductor die electrically connected to a package substrate through a plurality of electrical contacts. A lid above and substantially parallel to the top surface of the die forms a portion of the semiconductor circuit package. A plurality of lid supports each comprising a post and standoff member collectively create a separation between the lid and top surface of the die.

The invention has several important technical advantages. Various embodiments of the invention may have none, one, some, or all of these advantages as well as additional advantages. Because the lid may be held in place substantially by mechanical attachment to the substrate, it is less likely that a high strength epoxy would be used between the lid and the semiconductor die. The invention reduces the emphasis on bonding the lid to the die using epoxy. Accordingly, a highly thermally conductive material (whether adhesive or not) may be (but need not be) placed between the die and the lid, thus increasing thermal conductivity. The invention also may provide better mechanical support for the lid and reduce stress on the die when a heat sink is attached to the lid. In addition, the invention may provide mechanical support for the semiconductor circuit package vis-a-vis a printed circuit board to which the semiconductor circuit is attached. Thus, the invention may help absorb shock to the printed circuit board and/or semiconductor circuit.

BRIEF DESCRIPTION OF THE DRAWINGS

For a more complete understanding of the present invention and the advantages thereof, reference is now made to the following descriptions taken in conjunction with the accompanying drawings in which.

DETAILED DESCRIPTION OF EXAMPLE EMBODIMENTS OF THE INVENTION

Figure 1:
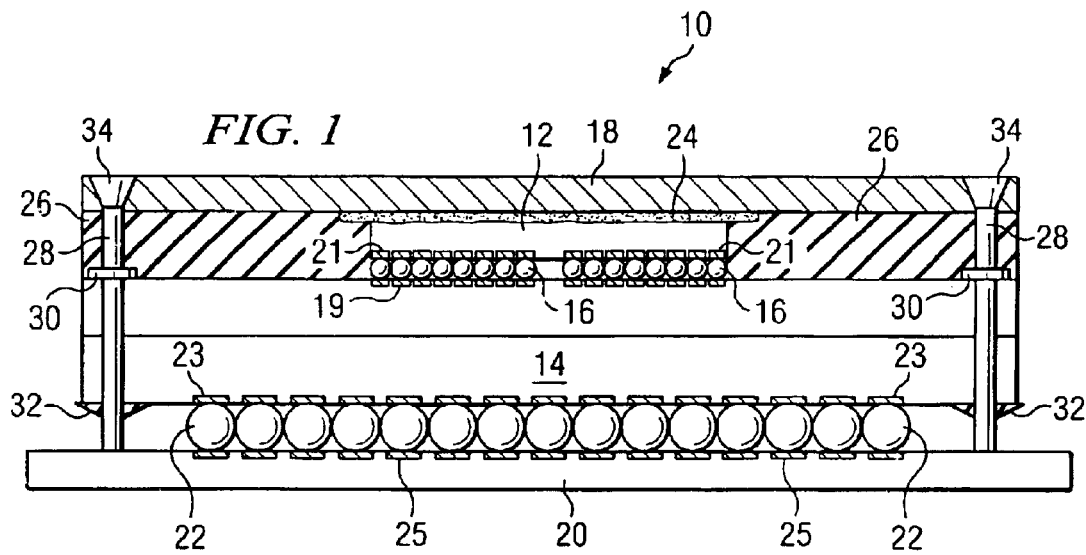
FIG. 1 illustrates a cross-sectional view of a semiconductor circuit constructed in accordance with the invention.
Figure 2:
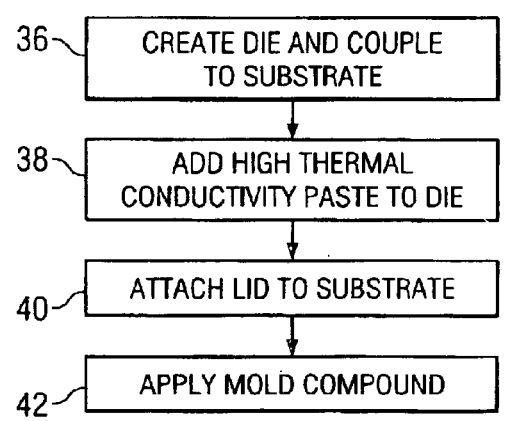
FIG. 2 illustrates a method of manufacturing a semiconductor circuit in accordance with the invention.

The preferred embodiment of the present invention and its advantages are best understood by referring to FIGS. 1 through 2 of the drawings, like numerals being used for like and corresponding parts of the various drawings.

FIG. 1 illustrates a cross sectional view of a semiconductor circuit 10 constructed in accordance with the invention and mounted to circuit board 20. Semiconductor circuit 10 comprises semiconductor die 12, substrate 14, bumps 16, lid 18, balls 22, contacts 19, contacts 21, contacts 23, and high thermal conductivity material 24, and mold compound 26. Other components of semiconductor circuit 10 will be discussed below.

It will be understood by those skilled in the art that semiconductor die 12 and/or substrate 14 may have a built-up layer (not explicitly shown) formed on them. While this embodiment illustrates a ball grid array with balls 22 used to electrically connect semiconductor circuit 10 to circuit board 20, balls 22 could be pins or columns or bumps or any other type of electrical contact without departing from the scope of the invention. Similarly, while bumps 16 are used to join die 12 to substrate 14, balls or any other type of electrical contact could be used to electrically connect semiconductor die 12 to substrate 14. Finally, those skilled in the art will understand that bumps 16 electrically connect contacts 21 on semiconductor die 12 to contacts 19 on substrate 14, while balls 22 electrically connect contacts 23 on substrate 14 to contacts 25 on circuit board 20. For purposes of this patent, the contacts will be deemed to be on semiconductor die 12 or substrate 14 even if semiconductor die 12 or substrate 14 has a built-up layer.

The invention employs one or more lid supports to attach lid 18 to the package substrate of semiconductor circuit 10. In this embodiment, a lid support may be placed at each corner of a square or rectangular package for semiconductor circuit 10. More or less lid supports may be used without departing from the scope of the invention. In addition, the lid supports may be positioned in places other than the corners.

In this embodiment, each lid support comprises post 8, standoff member 30, bolt 34 and harpoon attachment 32. Each lid support may be attached to semiconductor circuit 10 through holes in substrate 14 (which may also be referred to as a package substrate) as well as through holes in lid 18.

Harpoon attachment 32 is designed to retract by bending upwards and towards (or into) post 28 when being inserted into a hole in substrate 14 and/or lid 18. After passing through the hole, harpoon attachment 32 opens up to prevent the lid support from passing back through the hole either in lid 18 and/or substrate 14. The bottom portion of post 28 may rest upon circuit board 20 to provide mechanical support for semiconductor circuit 10. Alternatively, the bottom portion of post 28 may rest slightly above the surface of circuit board 20 so as to provide mechanical support when semiconductor circuit 10 suffers a force that would press circuit board 20 and semiconductor circuit 10 together. In some embodiments, the bottom of post 28 may be shorter such that no mechanical support is provided for semiconductor circuit 10 vis-a-vis circuit board 20. Preferably, where posts 28 are used to provide mechanical support vis-a-vis circuit board 20, the posts are given an appropriate length such that good electrical contact and bonding may occur between balls 22 and contacts 25 on circuit board 20 (as well as between balls 22 and contacts 23).

Lid 18 may be a conventional thermal lid (or a non-thermal lid). Often, lid 18 will have a cavity over die 12 (but does not need such a cavity). In this embodiment, standoff members 30 provide mechanical support for lid 18 and help to create a separation between lid 18 and the top surface of semiconductor die 12. By maintaining a separation between lid 18 and semiconductor die 12, the combination of posts 28 and standoff members 30 may reduce stress on semiconductor die 12 when a heat sink is attached to lid 18. Standoff members 30 may also help to achieve consistency in the distance between lid 18 and semiconductor die 12 when manufacturing a large number of semiconductor circuits 10.

In this embodiment, the interior of at least the top of post 28 is threaded to receive bolt 34. Bolt 34 contains a tapered head, which may be inserted into a counter-sunk hole in lid 18 such that the top of bolt 34 is below or near the surface of lid 18. One could use a bolt 34 without a tapered head and could omit counter sunk holes in lid 18 without departing from the scope of the invention. Also, one could use a screw or other type of fastener to attach lid 18 to post 28.

In this embodiment, a high thermal conductivity material 24 is placed between semiconductor die 12 and lid 18. High thermal conductivity material 24 could be omitted without departing from the scope of the invention. In addition, high thermal conductivity material 24 could be replaced by material with lesser thermal conductivity without departing from the scope of the invention. High thermal conductivity material 24 (or a substitute) may have adhesive properties or may not have adhesive properties.

In this embodiment, mold compound 26 fills space between lid 18 and substrate 14 where semiconductor die 12 is smaller than substrate 14. Mold compound 26 may be omitted without departing from the scope of the invention.

In addition to the options already discussed above, here are a number of variations that may be made in the structure illustrated in FIG. 1 without departing from the scope of the invention. For example, post 28, standoffs 30, and/or harpoon attachment 32 may be integrally formed with lid 18 or may be separate pieces. For example, when integrally formed, lid 18, post 28, standoffs 30 and harpoon attachment 32 may be formed of AlSiC. Other materials could be used without departing from the scope of the invention.

While this embodiment uses harpoon attachment 32 to secure post 28 to substrate 14, any type of attachment could be used without departing from the scope of the invention. For example, post 28 could be threaded bolts or screws and could be attached either using nuts on the underside of substrate 14 or by using an appropriate material in the holes in substrate 14 whereby a screw would anchor post 28 to substrate 14. In addition, harpoon attachments 32 could be omitted and post 28 attached to substrate 14 using solder or an adhesive material.

As noted, post 28 could be threaded either in the interior or the exterior without departing from the scope of the invention. Standoff member 30 may have any shape without departing from the scope of the invention. In this embodiment, standoff member 30 comprises a circular ring, which is integrally formed with post 28. However, standoff member 30 need not be integrally formed with post 28. For example, if the exterior of post 28 is threaded, then standoff member 30 may be a threaded washer or nut, which screws on to post 28. Thus, standoff members 30 may be adjustable (or not) without departing from the scope of the invention.

In this embodiment, bolts 34 are used to attach post 28 to lid 18. However, any method of attachment may be used without departing from the scope of the invention.

As noted above, post 28 could be integrally formed with lid 18. In addition, post 28 could be adhesively attached to lid 18 using an epoxy or some other appropriate substance.

In this embodiment, balls 22 and bumps 16 are of substantially uniform size. However, balls 22 and/or bumps 16 could be of varying sizes without departing from the scope of the invention.

FIG. 2 illustrates a method of manufacturing semiconductor circuit 10 as illustrated in FIG. 1.

Depending upon the options discussed with FIG. 1, these steps may be conducted in various ways. In step 36, semiconductor die 12 is created and coupled to substrate 14 using any known or otherwise suitable technique.

In step 38, a high thermal conductivity paste is applied to the top surface of semiconductor die 12. As noted above, this step could be omitted or a different material applied to the top surface of semiconductor die 12 without departing from the scope of the invention.

In step 40, lid 18 is attached to the substrate. In the illustrated embodiment, posts 28 are inserted through holes in substrate 14. When inserted into the holes, harpoon attachments 32 retract until they pass through the hole to the undersurface of substrate 14. At this point, the harpoon attachments 32 open once again to prevent posts 28 from passing back through holes in substrate 14. Next, the lid may be attached using bolts 14 screwed into each of the posts 28. Then, in step 42, mold compound 26 may be applied. As noted above, however, mold compound 26 may be omitted without departing from the scope of the invention. In addition, some type of mold compound 26 may be applied prior to attaching lid 18 to substrate 14. Depending upon the options chosen for the lid supports, variations in the above method will be evident to one skilled in the art. For example, if posts 28 are integrally formed with lid 18, then the use of bolts 34 would likely be omitted. If adhesive and/or solder is used to attach posts 28 either to lid 18 or substrate 14, then posts 28 could be attached to either lid 18 or substrate 14 in any order.

Although the present invention has been described in detail, it should be understood that various changes, substitutions, and alterations can be made hereto without departing from the spirit and scope of the invention as defined by the appended claims.

To aid the patent office and any readers of any patent issued on this application, in interpreting the claims appended hereto, applicants wish to note that they do not intend any of the appended claims to invoke paragraph 6 of 35 U.S.C. § 112 as it exists on the date of filing hereof unless the word "means for" or "step for" are used in the particular claim.

What is claimed is:

1. A semiconductor circuit, comprising:

a semiconductor die comprising, a die top surface, a die bottom surface, and a first plurality of electrical contacts coupled to the die bottom surface;

a package substrate comprising a substrate top surface, a substrate bottom surface, and a second plurality of electrical contacts wherein ones of the first plurality of contacts are electrically connected to ones of the second plurality of electrical contacts;

a lid above and substantially parallel to the die top surface;

a plurality of lid supports each comprising a post and standoff member wherein the lid supports collectively create a separation between the lid and die top surface.

2. The semiconductor circuit of claim 1, wherein the package substrate further comprises a series of openings receiving a portion of the post of at least one of the plurality of lid supports.

3. The semiconductor circuit of claim 2, wherein at least one of the plurality of lid supports further comprises a mechanical fastener capable of retractably passing through one of the series of openings and then opening after passing through such an opening to prevent the at least one of the plurality of lid supports from passing back through such opening.

4. The semiconductor circuit of claim 1, wherein at least the post portion of at least one of the plurality of lid supports is integrally formed with the lid.

5. The semiconductor circuit of claim 2, wherein at least one of the plurality of lid supports further comprises a mechanical fastener capable of passing through one of the series of openings to provide mechanical support for the semiconductor circuit when the semiconductor circuit is mounted on a printed circuit board.

6. The semiconductor circuit of claim 1, wherein the lid comprises a plurality of countersunk openings;

wherein at least one of the plurality of lid supports is attached to the lid using a bolt inserted into one of the plurality of countersunk openings.

7. The semiconductor circuit of claim 1, wherein the substrate comprises a package type selected from the group consisting of a ball grid array, a pin grid array, and a column grid array.

8. The semiconductor circuit of claim 1, wherein at least one of the plurality of lid supports further comprises a threaded post and wherein the standoff member for such lid support comprises a threaded washer.

9. The semiconductor circuit of claim 1, further comprising:

a high thermal conductivity paste disposed between the die top surface and the lid.

10. The semiconductor circuit of claim 2, wherein at least one of the plurality of lid supports is soldered to the substrate bottom surface.

11. The semiconductor circuit of claim 1, wherein at least one of the standoff members rests on the substrate top surface.

12. A method of making a semiconductor circuit, comprising:

forming a semiconductor die comprising, a die top surface, a die bottom surface, and a first plurality of electrical contacts coupled to the die bottom surface;

coupling the semiconductor die to a package substrate comprising a substrate top surface, a substrate bottom surface, and a second plurality of electrical contacts wherein ones of the first plurality of contacts are electrically connected to ones of the second plurality of electrical contacts;

connecting a lid above and substantially parallel to the die top surface using a plurality of lid supports each comprising a post and standoff member wherein the lid supports collectively create a separation between the lid and die top surface.

13. The method of claim 12, wherein the package substrate further comprises a series of openings receiving a portion of the post of at least one of the plurality of lid supports.

14. The method of claim 13, wherein at least one of the plurality of lid supports further comprises a mechanical fastener capable of retractably passing through one of the series of openings and opening after passing through such an opening to prevent the at least one of the plurality of lid supports from passing back through such opening.

15. The method of claim 12, wherein at least the post portion of at least one of the plurality of lid supports is integrally formed with the lid.

16. The method of claim 12, wherein the lid comprises a plurality of countersunk openings; and wherein the method further comprises attaching at least one of the plurality of lid supports to the lid using a bolt inserted into one of the plurality of countersunk openings.

17. The method of claim 12, wherein the substrate comprises a package type selected from the group consisting of a ball grid array, a pin grid array, and a column grid array.

18. The method of claim 13, wherein at least one of the plurality of lid supports further comprises a mechanical fastener capable of passing through one of the series of openings to provide mechanical support for the semiconductor circuit when the semiconductor circuit is mounted on a printed circuit board.

19. The method of claim 12, further comprising:

disposing a high thermal conductivity paste between the die top surface and the lid.

20. The method of claim 13, further comprising:

soldering at least one of the plurality of lid supports to the substrate bottom surface.

\* \* \* \* \*